United States Patent [19]

Engeler et al.

[11] 4,032,948
[45] June 28, 1977

[54] SURFACE CHARGE LAUNCHING APPARATUS

[75] Inventors: William E. Engeler, Scotia; Jerome J. Tiemann, Schenectady, both of N.Y.

[73] Assignee: General Electric Company, Schenectady, N.Y.

[22] Filed: Feb. 12, 1973

[21] Appl. No.: 331,483

Related U.S. Application Data

[63] Continuation of Ser. No. 84,666, Oct. 28, 1970, abandoned.

[52] U.S. Cl. .................. 357/24; 307/221 D; 307/304
[51] Int. Cl.² ................ H01L 27/10; H01L 29/78
[58] Field of Search ......... 357/24; 307/304, 223 C, 307/221 C, 221 D

[56] References Cited

UNITED STATES PATENTS

| | | | |
|---|---|---|---|
| 3,651,349 | 3/1972 | Kahng et al. | 357/24 |
| 3,657,614 | 4/1972 | Cricchi | 357/24 |
| 3,660,697 | 5/1972 | Berglund et al. | 357/24 |
| 3,789,240 | 1/1974 | Weimer | 357/24 |

OTHER PUBLICATIONS

*Electronics*, "New MOS Technique Points Way to Functionless Device", by Altman, May 11, 1970, pp. 112–118.

*Applied Physics Letters*, "Charge Coupled 8-Bit Shift Register", by Tompsett et al., pp. 111–115.

*Primary Examiner*—Andrew J. James
*Attorney, Agent, or Firm*—Julius J. Zaskalicky; Joseph T. Cohen; Jerome C. Squillaro

[57] ABSTRACT

Methods for storing and transferring electrical charges between adjacently spaced storage regions in semiconductor substrate are disclosed. In one embodiment, a plurality of adjacently spaced conductor members are insulatingly disposed over a major surface of a semiconductor substrate. Each storage region is separated from each other storage region by an electrical barrier region underlying the spacing between the adjacent conductor members. These barrier regions are controllably lowered by an electrode interposed between adjacent conductor members. Electrical charges stored in one storage region are transferred to an adjacent storage region by applying a voltage signal to the interposed electrode to lower the barrier region between the adjacent storage regions. Direction of charge transfer is controlled by the relative surface potentials of the adjacent storage regions and the magnitude of transfer is controlled by the height of the barrier region when lowered. Means for transferring partial charges are disclosed along with means for periodically regenerating charges to a predetermined level. Methods for transferring electrical charges with high efficiency of transfer are also disclosed.

2 Claims, 12 Drawing Figures

INVENTORS:
WILLIAM E. ENGELER;
JEROME J. TIEMANN,

THEIR ATTORNEY

INVENTORS:
WILLIAM E. ENGELER;
JEROME J. TIEMANN,
by
THEIR ATTORNEY

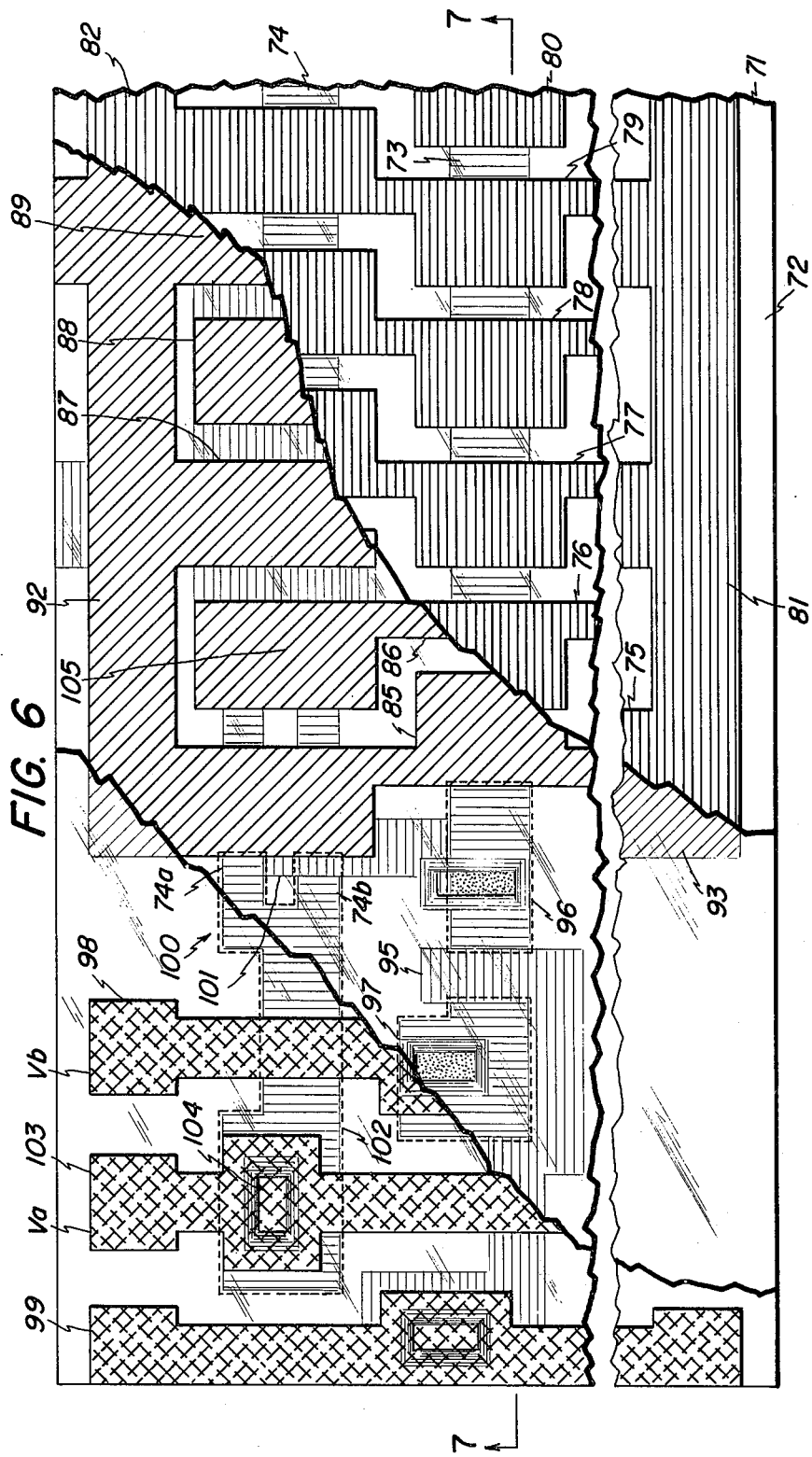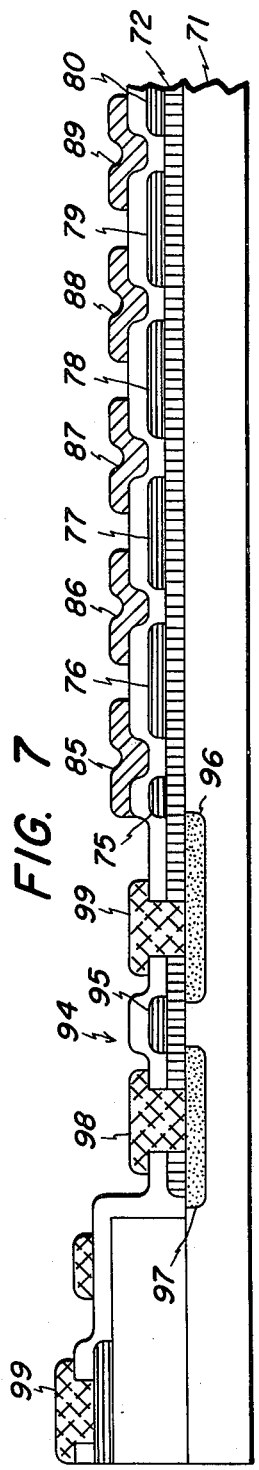

SURFACE CHARGE LAUNCHING APPARATUS

This is a continuation of application Ser. No. 84,666, filed Oct. 28, 1970, now abandoned.

The present invention pertains to methods and apparatus for storing and transferring electrical charges in a semiconductor substrate. This application is related to our copending applications Ser. No. 56,353, filed July 20, 1970 (U.S. Pat. No. 3,795,847) and Ser. Nos. 69,651 (U.S. Pat. No. 3,898,685) and 69,649 (U.S. Pat. No. 3,770,988) filed Sept. 4, 1970, and our concurrently filed applications Ser. Nos. 84,665 and 84,659 (U.S. Pat. No. 3,902,186), all of common assignee as the instant application and incorporated herein by reference thereto.

Methods and apparatus for storing electrical charges in the surface adjacent portions of a semiconductor substrate by the formation of depletion regions therein from an insulatingly overlying conductor member are described in the above-referenced patent applications. For example, in our copending application Ser. No. 56,353, we have disclosed, inter alia, a conductor-insulator-semiconductor (CIS) structure wherein electrical charges are stored and transferred along the surface-adjacent portions of the semiconductor substrate by applying appropriate voltage signals to a plurality of insulatingly overlying conductor members. In that application we provide storage and transfer under each conductor member and the transfer of electrical charge is achieved by overlapping adjacent depletion regions in the semiconductor substrate. As pointed out in that application, high density, high speed and transfer of electrical charges are provided.

The transfer of electrical charges along the surface of a semiconductor substrate involves an electric field-driven diffusion-like phenomenon in which the transfer of charge is definable by a diffusion equation. This equation is found to contain a diffusion constant which is proportional to the concentration of electrical charge. As a result, the rate of transfer of charge between two adjacent storage regions is greatest with high charge concentration and decreases rapidly with decreasing concentration. Therefore, it is exceedingly difficult to transfer substantially 100 percent of a particular charge in a short period of time. The usefulness of these devices is therefore somewhat limited.

It is therefore an object of this invention to provide an electrical charge storage and transfer apparatus and method in which charge controllably injected into a storage region is transferred to another storage region with high speed.

It is yet another object of this invention to provide a residual charge in each storage region and controllably transfer charges above this level.

It is yet another object of this invention to provide a method for refreshing binary information represented by two different non zero levels of charge.

It is yet another object of this invention to provide electrical charge barriers between adjacent storage regions.

It is still another object of this invention to provide methods for transferring charges between storage regions by controlling the height of electrical barriers therebetween.

Briefly, and in accord with one embodiment of our invention, these and other objects of our invention are obtained by providing a first plurality of adjacently spaced conductor members insulatingly overlying a semiconductor substrate and a second plurality of conductor members insulatingly interposed between the spaced regions of the first plurality of conductor members. A first and second plurality of electrical charge storage regions are formed in the surface-adjacent adjacent portions of the semiconductor substrate by applying voltages to the first plurality of conductor members. Electrical charges, stored in the first plurality of storage regions, are controllably transferred to the second plurality of adjacent storage regions by applying appropriate voltages to the insulatingly interposed conductor members so that electrical barrier regions existing between the adjacent storage regions are lowered, and the electrical charges stored in these regions flow to the adjacent storage regions. Direction of charge transfer is effected by controlling the surface potentials of the adjacent storage regions and the barriers therebetween, with the magnitude of transfer controlled by the height of the barrier regions that are lowered. Means for transferring less than a predetermined charge are disclosed along with apparatus for periodically receiving and regenerating the stored charges for subsequent transfer or readout.

The novel features believed characteristic of the present invention are set forth in the appended claims. The invention itself, together with further objects and advantages thereof, may be best understood by reference to the following detailed description taken in connection with the accompanying drawing in which:

FIG. 6 is a partial plan view of conductor-insulator-semiconductor charge storage and transfer apparatus in accord with one embodiment of our invention;

FIG. 7 is a partial cross-sectional view taken along the line 1—1 of FIG. 6;

Figure 1:
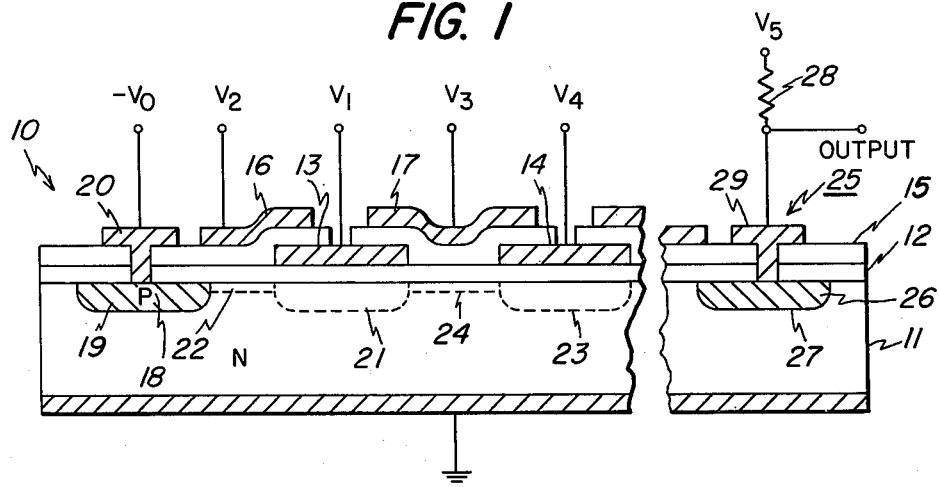
FIG. 1 is a partial cross-sectional view of a simplified embodiment of our invention.

By way of example, FIG. 1 schematically illustrates an embodiment of our present invention in which the theory of operation relating to the controlled transfer of electrical charges along the surface-adjacent portions of a semiconductor substrate is described. FIG. 1 illustrates a semiconductor substrate material 11 of one conductivity type, such as N-type silicon, for example, with an insulator layer 12 thereover. Electrical charge storage at the surface-adjacent portions of the semiconductor substrate 11 are provided under storage control electrodes 13 and 14. These electrodes may, for example, be high conductivity materials such as molybdenum, tungsten, silicon or any of the other non-reactive conducting and semiconducting materials. An insulator layer 15 overlies the storage control electrodes 13 and 14 and insulates these electrodes from overlapping charge transfer electrodes 16 and 17. The charge transfer electrodes may be formed, for example, of similar conductive materials employed for the charge storage electrodes 13 and 14, or may further include lower melting point temperature materials such as aluminum or gold, for example, where subsequent processing steps do not prove detrimental to their use.

The surface charge storage and transfer device 10 further comprises a means for introducing electrical charges into the surface-adjacent portion of the semiconductor substrate 11. For example, FIG. 1 illustrates a diffused region 18 of opposite conductivity from the substrate 11, thereby forming a P-N junction 19. Electrical contact is made to the diffused region 18 by a conductor member 20, for example, which may be formed at substantially the same time and of substantially the same material as the overlapping transfer electrodes 16 and 17, or alternately may be made of different materials. For example, conductor member 20 may be aluminum and electrodes 16 and 17, molybdenum.

Figure 2:
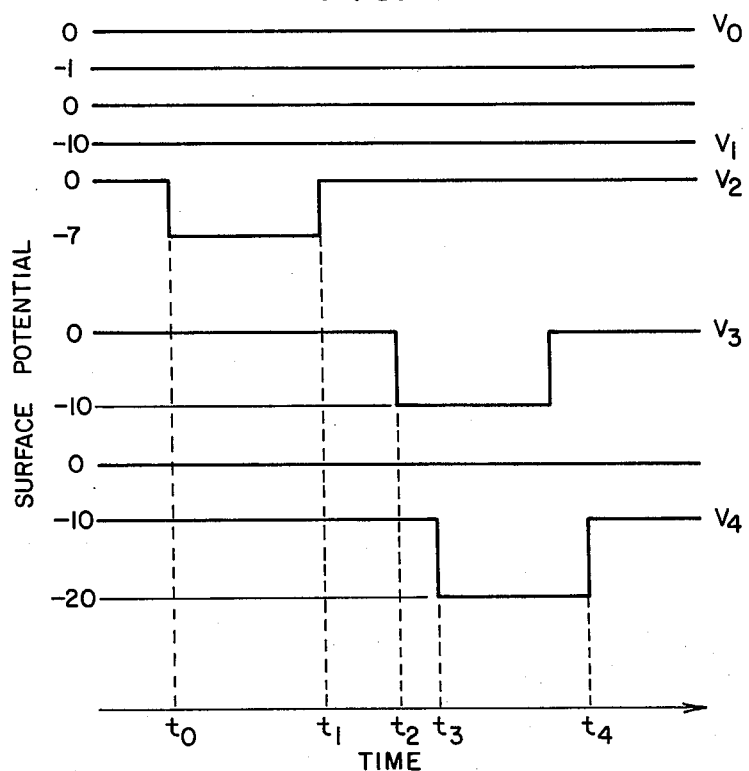
FIG. 2 illustrates typical voltage waveform suitable for transferring electrical charges along a semiconductor substrate.

The storage and transfer of electrical charge in accord with this embodiment of our invention is described with reference to the voltage waveforms of FIG. 2. The voltage waveform $V_0$ of FIG. 2 is a negative voltage of approximately 1 volt, and may be either D.C. or a pulsed signal. For convenience of description, FIG. 2 illustrates the voltage $V_0$ as a D.C. voltage. A voltage $V_1$, which may, for example, be a D.C. voltage of $-10$ volts, when applied to the control electrode 13 produces a depletion region or storage region 21 in the surface-adjacent portion of the semiconductor substrate 11. Those skilled in the art can appreciate that the surface potential of this depletion region varies with the thickness of the insulator layer 12. With an insulator thickness of approximately 1,000 Angstroms between the control electrode 13 and the semiconductor material 11, a surface potential of approximately 8.5 volts is produced when no mobile surface electrical charges are present. As will be described below, this depletion region is sufficiently deep to store these electrical charges.

The introduction of electrical charges into the storage region 21 from the P-N junction 19 is achieved by lowering an electrical barrier region 22 existing therebetween. This may be achieved, for example, by the application of a voltage signal $V_2$ to the transfer electrode 16. If the voltage $V_2$ is $-7$ volts, for example, the electrical barrier region 22 is lowered sufficiently so that an electrical charge in the form of minority carriers introduced by the P-N junction 19 are free to move to the storage region 21. The introduction of charge into the storage region 21 commences with the lowering of the barrier region and ends with the raising of the barrier region. As illustrated in FIG. 2, the barrier region is lowered at a time $t_0$ and raised at a time $t_1$.

The electrical charge introduced into the storage region 21 remains in this location so long as not acted upon by an external field. However, the charge within the storage region 21 may be transferred to an adjacent storage region 23 underlying the control electrode 14. In accord with one of the novel features of our present invention, this is achieved by applying voltage signals $V_3$ and $V_4$ to to the electrodes 17 and 14, respectively. The voltage $V_3$ lowers a barrier region 24 between the storage regions 21 and 23 and the voltage $V_4$ produces the storage region 23. FIG. 2 illustrates the voltage signal $V_3$ as commencing at a time $t_2$ and the voltage signal $V_4$ commencing at a time $t_3$. Hence, the barrier region 24 is lowered at time $t_2$ and the storage region 23 is formed at time $t_3$. Electrical charge is transferred from the storage region 21 to the storage region 23 at the time $t_3$, during the coincidence of voltages $V_3$ and $V_4$. As will be described more fully below, the time required to transfer charge between these two storage regions is dependent upon the magnitude of the charge with the storage region 21 and the extent of charge transfer desired; i.e., a partial charge may be transferred from the storage region 21 more quickly than a total charge. The extent of charge transfer in part is determined by the extent to which the barrier region 24 is lowered.

As stated above, the transfer of charge commences with time $t_3$, the coincidence of voltage signals $V_3$ and $V_4$. Those skilled in the art can therefore readily appreciate that the voltage signal $V_3$ could, in fact, occur at any time during the time period $t_3$ to $t_4$. Whichever timing sequence employed, the transfer of electrical charges occurs in substantially the same manner. The charge stored within the region 23 is now ready to be transferred to the next adjacent storage region, if desired. Additionally, a new charge may be introduced into the storage region 21 as the charge is transferred from the region 23 to its next adjacent storage region. In this manner, a plurality or train of electrical charges may be transferred along the surface-adjacent portions of a semiconductor substrate. The electrical charges may be representative of an analog signal or a digital signal, if desired. A digital signal, for example, may be represented by a binary code with a charge above a predetermined level indicative of a binary 1, for example, and a charge below a predetermined level representative of a binary 0. In such a case, the digital information would be introduced by replacing the voltage $V_0$ with the binary coded signal.

After the introduction and desired number of transfers, the electrical charges may be removed from the surface-adjacent portion of the semiconductor substrate by a suitable charge receive device 25, such as the one illustrated in FIG. 1. This device includes a diffused region 26 which forms a P-N junction 27 with the semiconductor substrate 11. The P-N junction 27 is biased from a voltage source $V_5$ through a load device 28 and an electrode 29 which contacts the surface of the diffused region 26. The load device 28 may, for example, include a resistor, transistor or other suitable signal sensing means.

An output signal is derived from the receive device 25 each time an electrical charge is transferred to the P-N junction 27. This output signal varies in accord with the magnitude of the transferred charge. However, the magnitude of the charge received at the output device 25 is not necessarily equal to that introduced by the P-N junction 19. For example, during the course of charge transfer, a small portion of the electrical charge may be lost to the semiconductor bulk. Also, as the speed of transfer increases, a small portion of the electrical charge is left behind and hence with each succeeding transfer, less and less charge is transferred. Therefore, the signal received at the receive device is not necessarily of the same magnitude as that introduced by the P-N junction 19. One means for overcoming this signal degradation is disclosed in our copending application Ser. No. 69,649. In that application we disclose a receive device which exhibits gain. Where the stored charges are representative of digital information in the form of a binary code, the electrical charges received may be regenerated and redirected along a different storage channel, if desired, in a manner more fully described in our concurrently filed application Ser. No. 84,665.

In accord with one of the novel features of our present invention, the loss of information due to the misplacement or loss of signal charge is minimized in at least three ways. First, a residual or bias charge is maintained in each storage region at all times during operation. The presence of this residual charge speeds up the transfer of the excess charge, which represents the information, so that at a given clock rate, a smaller amount of signal charge is left behind. Second, during operation, the surface potential of the storage regions are never permitted to become less negative than a certain minimum level so that losses due to charge injection into the semiconductor bulk are avoided. And thirdly, the width of the barrier region existing between adjacent storage regions can be made smaller than the storage regions so that electrical charge injected into the semiconductor bulk as the barrier region is raised is reduced. Still other means for increasing the efficiency of charge transfer are disclosed herein and will become more apparent from the following description with reference to FIGS. 3a through 3d and FIG. 4.

Figure 3:
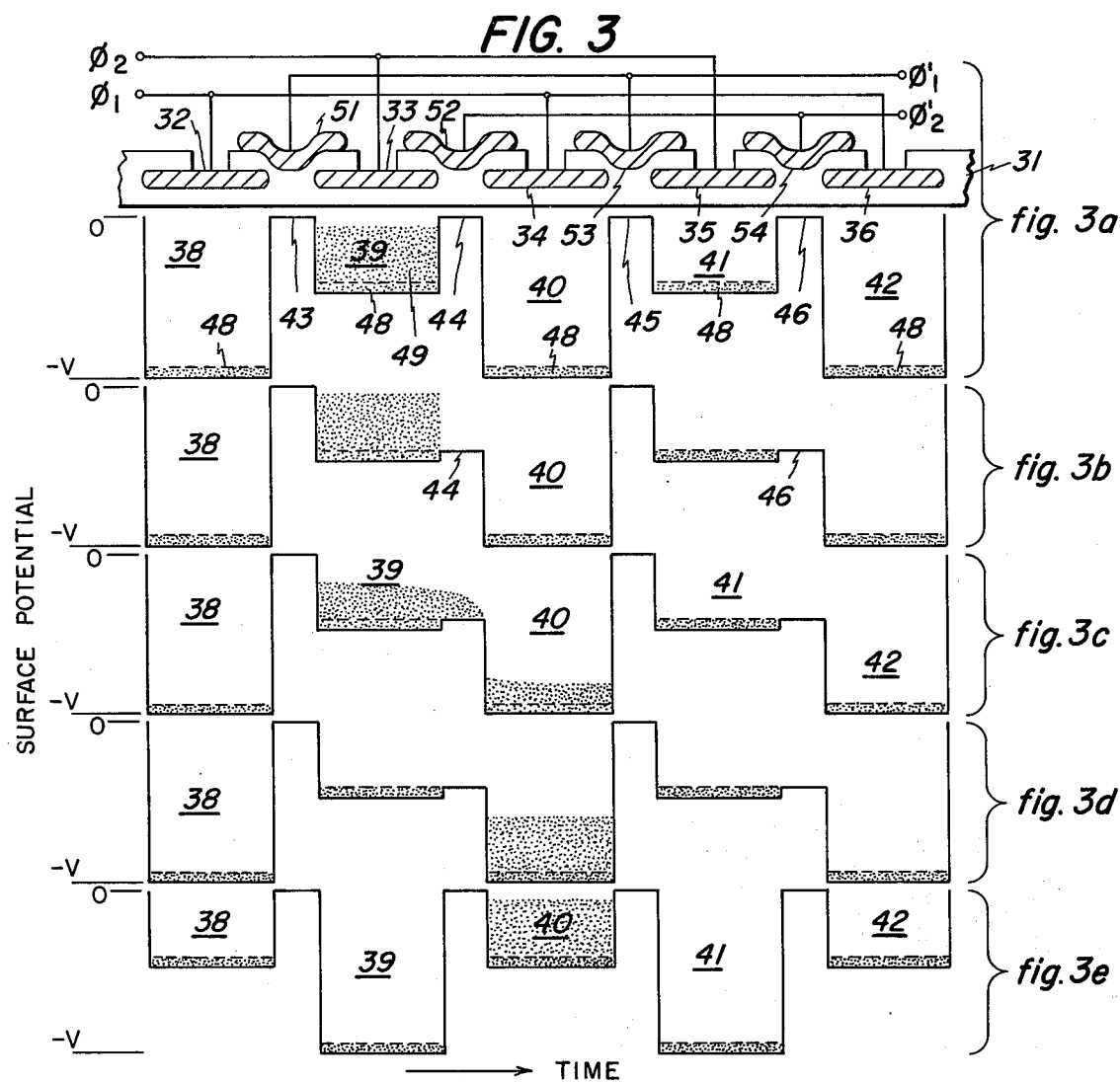
FIGS. 3a – 3e are partial schematic illustrations in cross-section of an embodiment of our invention illustrating the transfer of electrical charges along a semiconductor substrate.

FIG. 3a schematically illustrates a plurality of adjacently spaced storage control electrodes 32 through 36 insulated from the surface of a semiconductor substrate by an insulator layer 31. A plurality of transfer control electrodes 51 through 54 are insulatingly interposed between the adjacently spaced storage control electrodes. Storage control electrodes 32, 34 and 36 are electrically connected to a first voltage signal $\phi_1$ and storage control electrodes 33 and 35 are connected to a second voltage signal $\phi_2$. Transfer control electrodes 51 and 53 are connected to a third voltage signal $\phi_1'$ and transfer control electrodes 52 and 54 are connected to a fourth voltage signal $\phi_2'$.

Figure 4:
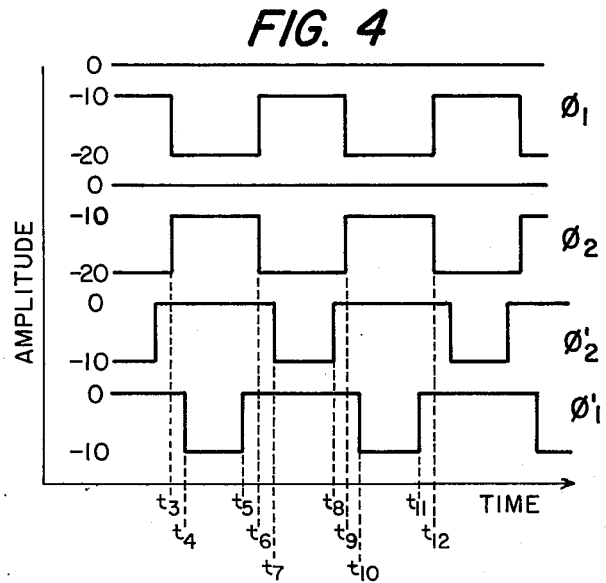
FIG. 4 illustrates typical voltage waveforms suitable for transferring electrical charges along the surface of a semiconductor substrate.

FIG. 3a also illustrates the surface potentials existing in the semiconductor substrate for various conditions for the four voltage signals. More specifically, FIG. 3a illustrates the storage regions 38 through 42 as substantially underlying the storage control electrodes 32 through 36, respectively, with narrow barrier regions 43 through 46 interposed between each adjacent storage region. The difference in surface potentials between the storage regions 38 and 39, for example, results from the difference in the voltage signals $\phi_1$ and $\phi_2$. This difference is illustrated in FIG. 4 during the time period $t_5$ to $t_6$. During this interval, the first voltage signal $\phi_1$ is approximately $-20$ volts and the second voltage signal $\phi_2$ is $-10$ volts. Hence, in the absence of signal charge, the surface potential for the storage region 38 is approximately twice that for the storage region 39. During this same time interval, the third and fourth voltage signals $\phi_1'$ and $\phi_2'$ are zero and hence the surface potential in the barrier regions 43 through 46 is also zero, and hence each storage region is electrically isolated from each other storage region by the "height" of the barrier.

The barrier regions 43 through 46 exist during the time interval $t_5$ to $t_7$ because this region of the semiconductor substrate is not under any substantial influence of an electric field. The barrier regions therefore prevent electrical charges in one storage region from moving to another storage region. These barrier regions, therefore, perform a very significant function in the operation of this embodiment of our invention. By lowering the barrier region, however, electrical charges from one storage region and permitted to flow to the next adjacent storage region, at least to the extent that the barrier is lowered.

In accord with one of the novel features of our present invention, the height of the barrier region is controlled by the magnitude of a voltage signal applied to the transfer control electrode insulatingly interposed between adjacent storage control electrodes. For example, during the time period $t_7$ to $t_8$, the third voltage signal $\phi_2'$ becomes $-10$ volts. Since this voltage signal is applied to transfer control electrodes 52 and 54, the barrier regions 44 and 46, respectively, underlying these electrodes are lowered. This condition is illustrated in FIG. 3b by the new position of the barrier regions 44 and 46. The manner in which the lowering of the barrier region is used to effect charge transfer will be described more fully below. First, however, assume that each storage region 38 through 42 contains a residual charge, 48 and that storage region 39 includes a charge 49 in excess of the residual charge 48. Further, assume that the storage region 41 contains no charge but for the residual charge 48. The existence of a charge 49 within the storage region 39 may, for example, be representative of a binary 1 and the absence of an excess charge within the storage region 41 a binary 0.

In operation, the electrical charge 49 within the storage region 39 is transferred to the storage region 40 by first lowering the barrier region 44 existing between these two regions. As described above, this is achieved by applying a voltage $\phi_2'$ to the transfer control electrode 52. As illustrated in FIG. 4, at time $t_7$, the voltage applied to the transfer control electrode 52 changes from 0 to $-10$ volts, for example. As a result, the barrier level 44 is lowered sufficiently so that the electrical charge within the storage region 39 is free to move to the right FIG. 3b illustrates this condition by the lowering of the barrier 44 and FIG. 3c illustrates a portion of the charge as it is controllably transferred from storage region 39 to storage region 40. FIG. 3d illustrates that the only charge remaining in storage region 39 is the residual charge 48 and that substantially all excess charge is transferred to the storage region 40. Assuming that this transfer of charge took place during the time interval $t_7 - t_8$, the third voltage signal $\phi_2'$ returns to zero and hence the barriers 44 and 46 are re-established.

The electrical charge now stored in region 40 can not, however, be transferred to the next adjacent storage region 41 unless the surface potential underlying storage control electrode 35 is greater (i.e., more negative) than that underlying storage control electrode 34. As is apparent from FIG. 3d, this condition does not exist until a time $t_9$, whereupon the first voltage signal $\phi_1$ returns to $-20$ volts and the second voltage signal $\phi_2$ switches to $-10$ volts. During this time, $t_9 - t_{12}$, the surface potential underlying control electrode 35 is greater than that underlying electrode 34; hence, electrical charge stored in the storage region 40 can be transferred to the next adjacent storage region 41 when the barrier region 45 existing between these storage regions is lowered. In a manner substantially similar to that described above, this transfer of charge is effected during the time period $t_{10}$ to $t_{11}$.

A particularly advantageous characteristic of our invention is the speed and efficiency with which electrical charges may now be transferred from one storage region to another. Since the storage regions each contain a residual charge which is not transferred, the time required for transfer of substantially all the additional charge except for the residual charge is greatly reduced. This characteristic of our invention can be better appreciated by reference to FIG. 5 wherein typical variations of voltage with time are illustrated for the transfer of charge from one storage region to the next adjacent storage region. As illustrated by the curves 61 and 62, a substantially large portion of the charge is transferred in the first four or five units of time and that an exceptionally longer period of time is required to transfer the remaining charge. Hence, the benefits of providing a residual charge are readily apparent. The amount of residual charge which may advantageously provide improved rates of charge transfer depends, in part, on the size of the storage region, the magnitude of the total stored charge and the spacing between adjacent storage regions and naturally on the characteristics of the semiconductor substrate.

Figure 5:
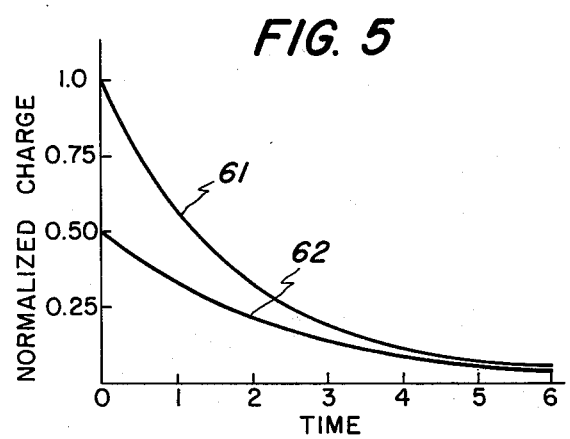
FIG. 5 illustrates the percentage of electrical charge transferred with time for different initial charge levels.

FIG. 5 illustrates yet another important characteristic of electrical charge transfer apparatus which may be used to great advantage in certain applications. Specifically, at time 0, curve 61 begins at a normalized value 1, whereas curve 62 begins at a normalized value of 0.5. In other words, curve 61 represents a storage region containing a maximum charge, whereas curve 62 represents a similar storage region having only 50 percent of its maximum charge. After four or five units of time, however, when the initial charge levels have decayed to a normalized level of approximately 10 percent, the difference between the two charge levels is very small, in fact, the two curves differ in charge by about one percent or less. This characteristic of charge transfer is particularly significant since it permits significantly higher rates of transfer without loss of information than would othewise be possible. Those skilled in the art can readily appreciate this fact more clearly by first considering some of the difficulties encountered in transferring electrical charges along the surface of a semiconductor substrate.

For example, when charge transfer devices are employed as shift registers, long trains of charges are transferred from one storage region to another in accord with a particular clocking rate. As described previously, if it is desired to transfer substantially all charge from one storage region to another then the rate of transfer must be substantially lower than if only a portion of the total charge is transferred. Where the charges being transferred are representative of binary 1's and 0's, and a binary 1 is represented by a first charge level and a binary 0 by a second lesser charge level, then it is essential to maintain the integrity of the signals; otherwise, the information is lost. A rapid rate of transfer will hence cause some of the charge from a binary 1, for example, to be left behind and if a sufficient number of these transfers occur, then the binary 1 level is seriously degraded. Additionally, the loss of charge may not be into the semiconductor bulk material, but may remain within the storage region to be added to by the next signal charge. In the event that the subsequent electrical charge is a binary 0 of lesser charge level, it will have acquired the additional charge left behind from the previous charge. In this situation, after several transfers, the binary 0 may not be distinguishable from the binary 1 and hence the information would be lost. Accordingly, it can be readily appreciated that the maximum rate of transfer of information in the form of electrical charge is determined primarily by the number of transfers of substantially less than 100 percent of the excess charge which can be tolerated before the charge levels corresponding to binary 1's and binary 0's become indistinguishable.

Superposed over the foregoing problem is the matter of the semiconductor substrate storage interval which is not infinitely long. In fact, storage intervals may only be in the order of seconds or less. Hence, it is essential that the electrical charges are transferred as rapidly as possible within this storage interval or that they are periodically regenerated so that the information, contained in the form of various charge levels, is not lost. Methods and apparatus for periodically regenerating electrical changes are more fully described in our concurrently filed application Ser. No. 84,665 and are described later only to the extent necessary for an appreciation of the present invention. Accordingly, reference may be made to this application for a more detailed description, if necessary.

Thus, in accord with the method of transferring information in the form of electrical charges, where a binary 1 is represented by an initial charge level of 100 percent of a normalized value and a binary 0 is represented by 50 percent of the same value, the degradation of information is caused by the difference in the amount of charge left behind for these two signals, not by the total amount of the charge left behind, as would be the case had a binary 0 been represented by the absence of excess charge. In this regard, FIG. 5 illustrates that the separation between curves 61 and 62 is much less than the separation between curve 62 and the abscissa. Many time periods have to elapse before the separation between curve 62 and the abscissa is as small as that achieved at an earlier time between the curves 61 and 62. Hence, high rates of charge transfer without loss of information are possible.

In addition, if the predetermined range for a binary 1 varies between 60 and 80 percent of a normalized charge and the predetermined range for a binary 0 varies between 20 and 40 percent of a similar charge, then by employing a threshold device which distinguishes between the different levels, electrical charges may be transferred at exceedingly high rates without loss of information. The transfer of electrical charges in this mode of operation is substantially similar to that described previously but for the rate of transfer. Since this is controlled by the frequency of the voltage signals applied to the storage and transfer control electrodes, the embodiment of our invention illustrated in FIG. 1 may be employed. Another particularly useful embodiment of our invention, however, is illustrated in FIG. 6.

FIG. 6 illustrates an electrical charge storage and transfer apparatus comprising a semiconductor substrate 71 having an insulator layer 72 thereover. For purposes of clarity in describing our invention, the semiconductor substrate 71 is considered to be N-type silicon, for example, of 1,1,1 crystallographic orientation with an insulating layer of silicon dioxide. It is to be understood, however, that other semiconductor materials such as germanium, Group III–V and II–VI semiconductor compounds, such as cadmium sulfide, gallium arsenide and indium antimonide, may be employed and insulator materials, such as silicon nitride, silicon oxynitride or combinations of insulators may be employed if desired. Additionally, in addition to N-type semiconductor substrates, opposite conductivity P-type substrates with N-type diffused regions may also be employed if desired. In this case, the diffused regions could, for example, be formed by diffusion from a phosphorus source as opposed to a boron source and the applied potentials would be of an opposite polarity. Accordingly, our invention may be practised by employing various combinations of materials and those illustrated and described herein are intended by way of example and not by way of limiting our invention.

The insulator layer 72 is provided with a plurality of charge storage and transfer channels, with channels 73 and 74 illustrated in the drawing. These channels may, for example, be formed by selectively etching the insulator layer 72 to the surface of the semiconductor substrate and then subsequently forming a thinner insulator layer in the channel regions. For example, the insulator layer may comprise a pyrolytically formed silicon dioxide material having a thickness of approximately 10,000 A in regions outside the channels. In the channel regions, the oxide thickness may be about 1,000 A. As will become more apparent from the following description, the thickness of the silicon dioxide layer within the channel regions and outside the channel regions may vary with the particular circuit parameters since the thicker oxide layer primarily assures that the portions of the semiconductor substrate underlying the thick silicon dioxide are not activated by signals conducted through overlying conductor members.

The charge storage and transfer apparatus illustrated in FIG. 6 further comprises a first plurality of conductor members 75 through 80 with conductor members 75, 77 and 79 connected to a common electrical bus 81 and conductor members 76, 78 and 80 connected to another common electrical bus 82. As illustrated, conductor members 75, 77 and 79 are interdigitated with conductor members 76, 78 and 80. The conductor members 75 through 80 and the common electrical buses 81 and 82 may, for example, be formed by depositing a continuous conductive material over the insulator layer 72 and then appropriately masking and etching this conductive material to form the illustrated conductor members. Conductive materials such as, for example, molybdenum, tungsten, silicon, germanium or any of the other numerous non-reactive, conducting and semiconducting materials capable of withstanding the thermal stresses involved in semiconductor fabrication may be advantageously employed in practising our invention. Conductors having high conductivity such as tungsten and molybdenum are particularly advantageous because of their high conductivity which permits long, narrow conductors to be employed, where necessary.

Electrical charges are stored and transferred along the surface-adjacent portions of the semiconductor substrate in substantially the same manner described above with reference to the schematic illustrations of FIG. 3a – 3d. FIG. 7, a cross-sectional view taken along the lines 1—1 of FIG. 6, illustrates the relationship between the storage control electrodes 72 and 76 and the transfer control electrodes 85 through 89 insulatingly disposed in overlapping relation with the storage control electrodes. The transfer control electrodes are also arranged in an interdigitated manner so that voltage signals substantially similar to those illustrated in FIG. 4 may be employed to control the barrier regions between the charge storage regions. Transfer control lines 85, 87 and 89 are connected to a common electrical bus 92 and conductor members 86 and 88 are connected to a common electrical bus 93. As illustrated, each electrical bus, 81, 82, 92 and 93 include contact pads protruding from the bus to provide means for connecting control signals to these storage and transfer electrodes. For example, electrical bus 81 is connected to a voltage signal similar to $\phi_1$ illustrated in FIG. 4 and bus 82 is connected to $\phi_2$; bus 92 is connected to $\phi_2'$ and bus 93 is connected to $\phi_1'$, also illustrated in FIG. 4.

FIG. 7 also illustrates a charge receive element 94 comprising an insulated gate field-effect transistor, for example, including a gate electrode 95 insulatingly disposed over the semiconductor substrate and overlapping diffused regions 96 and 97. As illustrated, transfer control electrode 75 overlaps a portion of the diffused region 96. This overlap permits transfer of charge between the storage region underlying storage electrode 75 and the diffused region 96.

Electrical charges are transferred along the surface-adjacent portion of the semiconductor substrate from right to left, for example, and are received by the charge receive device 94 in the following manner. First, a voltage $V_b$ is applied to an electrode 98 which contacts the diffused region 97 and an appropriate gate voltage is connected to the insulated gate electrode 95 through an electrode 99. The gate voltage may, for example, be a signal substantially similar to that illustrated in FIG. 4 by the waveform $\phi_1'$. During the time prior to $t_6$ when $\phi_1'$ is at −10 volts, the voltages applied to the gate electrode 95 and the electrode 98 cause the diffused region 96 to become charged to a voltage substantially similar to the voltage $V_b$. At time $t_6$, the voltage applied to the gate electrode 95 has been brought to zero and hence the diffused region 96 becomes electrically isolated from the surrounding regions except for a connection to an electrode 99. As is more fully described in our concurrently filed application Ser. No. (RD-3800), the arrival of an electrical charge from the charge storage and transfer channel 73 changes the voltage on the diffused region 96 by an amount proportional to the magnitude of the transferred charge. By monitoring or sensing the voltage change at this point, an electrical readout signal representative of the charges stored in the storage channel can be obtained. A typical device for performing this function is illustrated in our concurrently filed application. Also, the voltage change may be utilized to regenerate or refresh the electrical charge for subsequent transfer. FIG. 6 illustrates a charge regeneration device 100 suitable for regenerating binary 1's and 0's which are initially characterized, for example, by 100 percent of a normalized charge and 50 percent of a normalized charge, respectively. As illustrated in FIG. 6, the charge storage and transfer channel 74 is separated into two substantially equal portions 74a and 74b separated by a region of thick insulator material. A gate electrode 101 overlies the channel region 74b and is electrically connected to the diffused region 96 by the contacting electrode 99. The gate electrode 101 may, for example, be formed during the masking and etching of the storage control electrodes 85 through 89. An electrical charge is introduced into the channel region 74 through a diffused region 102 formed in the surface-adjacent portions of the semiconductor substrate in the channel region 74. Electrical contact between the diffused region 102 and a voltage carrying conductor 103 is provided by the conductor filled aperture 104. Conductor 103 is connected to a source of voltage $V_a$ which is selected so as to inject or introduce charge into the channel region 74. The amount of charge injected is controlled, in part, by the voltage appearing on the gate electrode 101. This voltage is derived from the diffused region 96 which receives the electrical charges being transferred along the transfer channel 73. The voltage $V_a$ applied to the conductor member 103 is adjusted so that when no charge is received by the diffused region 96, the voltage appearing on the gate electride 101 is sufficient to permit electrical charge to flow in the depletion region under the gate electrode into the channel 74b. In addition to the charge injected under the gate electrode 101, charge is also injected into the channel region 74a and is received within the storage region underlying the storage control electrode 85. The two charges injected into the channels 74a and 74b are transferred along each respective channel by the overlying storage and control electrodes in substantially the same manner as described above until they arrive at a point 105 along the storage channel 74 and underlying electrode 86 where the two signals are combined to produce an electrical charge representative of 100 percent of a normalized charge.

Electrical charges, therefore, received at the receive device 94 in channel 73 having a magnitude less than a predetermined value, such as a binary 0, produce a binary 1 in the next adjacent channel 74 by the charge regeneration apparatus contained therein. In the event, however, that the charge received by the diffused region 96 is of a sufficient magnitude to raise the voltage applied to the gate electrode 101 so that the surface potential thereunder is higher than $V_a$, electrical charges are inhibited from flowing along the storage and transfer channel 74b. The electrical charge flowing along the channel 74a, however, is not inhibited and hence this charge is transferred along the channel to the point 105 where there is no charge to be combined therewith and hence the charge transferred into the main portion of the storage and transfer channel 74 is only approximately 50 percent of that previously transferred. The difference between the total charge previously injected and that injected as a result of the larger charge received by the diffused region 96 is a function of the area of each channel 74a and 74b relative to the total area of the channel 74. For example, as illustrated, channels 74a and 74b are of equal cross-sectional area and hence each provides approximately 50 percent of the total charge that can be injected into the charge storage and transfer channel 74. Obviously, other proportions may be utilized if desired.

As described previously, the regeneration of electrical charges requires an ability to distinguish between electrical charges above and below a predetermined threshold value. In the embodiment of our invention illustrated in FIG. 6, this threshold value is determined by the magnitude of the voltage $V_a$ applied to the conductor member 103. By selecting this voltage in accord with the charge applied to the gate electrode 101 and the magnitude of the charge to be injected into the channel region 74, electrical charges received at the diffused region 96 may be regenerated in a complementary manner; i.e., the regenerated signal is the complement of the receive signal. It should be noted, however, that the regenerated signal does not depend of the magnitude of the received charge but rather is dependent only on whether the transferred charge is above or below a threshold value. In this manner, the partial degradation of the charge resulting from previous transfers along the substrate are eliminated.

Those skilled in the art can readily appreciate that numerous advantages flow from our invention. Specifically, in accord with this method of transferring electrical charges between adjacent storage regions separated by barrier regions controlled transfer of electrical charge is provided. Additionally, by maintaining a constant residual charge in the storage regions, the speed of transfer between adjacent regions is substantially enhanced. Further, by maintaining the width of the barrier regions relatively small when compared with the storage regions, the loss of charge into the semiconductor bulk is substantially reduced and the time of transfer between adjacent storage regions is also substantially reduced. Further, although our invention is primarily described with reference to binary encoded information, multilevel codes, for example, can also be employed.

Accordingly, while only certain embodiments and examples of our present invention have been described herein, it is apparent that many modifications and changes will occur to those skilled in the art. Therefore, we intend, by the appended claims, to cover all such modifications and changes as fall within the true spirit and scope of our present invention.

What we claim as new and desire to secure by Letters Patent of the U.S. is:

1. Device for introducing levels of charge in surface charge apparatus in accordance with an information bearing signal comprising a semiconductor substrate of one conductivity type having a surface adjacent portion, a first conductive member insulatingly overlying said surface adjacent portion of said substrate, means for applying a first biasing voltage to said first conductive member with respect to said substrate to form a first depletion region in the surface-adjacent portion of said substrate underlying said first conductive member having a surface potential of a first value in the absence of minority carriers in said first depletion region, a region of opposite conductivity type in said surface adjacent portion of said substrate spaced from said depletion region, a barrier region in said substrate between said region of opposite conductivity and said first depletion region, means for applying a second biasing voltage to said region of opposite conductivity type with respect to said substrate to provide a potential in said region of opposite conductivity type of a second value with respect to said substrate, the surface potential of said depletion region of said first value being energetic lower than the potential of said second value for minority carriers in said substrate, a second conductive member insulatingly overlying said barrier region, means for applying a control voltage between said second conductive member and said substrate for lowering the surface potential of said barrier region to a third value lower than said second value to cause the surface potential of said first depletion region to equilibrate with the potential of said region of opposite conductivity type thereby to establish in said first depletion region a predetermined level of charge dependent on said first and second values of voltage, a plurality of spaced conductor members insulatingly overlying the surface adjacent portion of said substrate to form an information storage and transfer channel for the transfer of electrical charge along the surface adjacent portion of said substrate, means for applying periodic phase related voltages to said spaced conductor members to incrementally move charge in said storage and transfer channel, means for maintaining said first biasing voltage fixed during a period of said phase related voltages, means for periodically transferring charge introduced in said first depletion region into a depletion region of said storage and transfer channel for transfer therealong.

2. The device of claim 1 in which said second conductive member insulatingly overlies a portion of said first conductive member as well as said barrier region.

* * * * *